US011946991B2

(12) United States Patent
Oh et al.

(10) Patent No.: US 11,946,991 B2
(45) Date of Patent: Apr. 2, 2024

(54) METHOD AND DEVICE FOR MAGNETIC RESONANCE IMAGING BY IMPLEMENTING INDUCTIVE TUNING CIRCUIT FOR ADJUSTING OPERATING FREQUENCY AND USING TOP- HAT DIPOLE ANTENNA HAVING LENGTH FREELY ADJUSTABLE DEPENDING ON REGION OF INTEREST

(71) Applicant: KOREA UNIVERSITY RESEARCH AND BUSINESS FOUNDATION, SEJONG CAMPUS, Sejong (KR)

(72) Inventors: Changhyun Oh, Sejong (KR); Suchit Kumar, Sejong (KR); Jongmin Kim, Sejong (KR); Junsik Yoon, Sejong (KR)

(73) Assignee: Korea University Research and Business Foundation, Sejong Campus, Sejong (KR)

( * ) Notice: Subject to any disclaimer, the term of this patent is extended or adjusted under 35 U.S.C. 154(b) by 0 days.

(21) Appl. No.: 17/782,594

(22) PCT Filed: Dec. 1, 2020

(86) PCT No.: PCT/KR2020/017356
§ 371 (c)(1),
(2) Date: Jun. 3, 2022

(87) PCT Pub. No.: WO2021/112523
PCT Pub. Date: Jun. 10, 2021

(65) Prior Publication Data
US 2023/0025066 A1    Jan. 26, 2023

(30) Foreign Application Priority Data

Dec. 4, 2019   (KR) .................. 10-2019-0159556
Nov. 30, 2020  (KR) .................. 10-2020-0164661

(51) Int. Cl.
*G01R 33/34*  (2006.01)
*G01R 33/36*  (2006.01)
*G01R 33/48*  (2006.01)

(52) U.S. Cl.
CPC ....... *G01R 33/34038* (2013.01); *G01R 33/34* (2013.01); *G01R 33/34046* (2013.01); *G01R 33/3628* (2013.01); *G01R 33/48* (2013.01)

(58) Field of Classification Search
CPC .............. G01R 33/34; G01R 33/34046; G01R 33/34038; G01R 33/34076; G01R 33/341;
(Continued)

(56) References Cited

U.S. PATENT DOCUMENTS 4,887,039 A * 12/1989 Roemer ............ G01R 33/3628
324/318
5,619,996 A *  4/1997 Beresten .......... G01R 33/34046
324/318
(Continued)

FOREIGN PATENT DOCUMENTS

KR   10-2015-0033440 A   4/2015
KR   10-2018-0045583 A   5/2018
(Continued)

OTHER PUBLICATIONS

International Search Report dated Mar. 5, 2021, for corresponding International Patent Application No. PCT/KR2020/017356, along with an English translation.
(Continued)

*Primary Examiner* — Steven L Yeninas
(74) *Attorney, Agent, or Firm* — Hauptman Ham, LLP

(57) ABSTRACT

Provided is a device for acquiring a magnetic resonance image signal includes a plurality of top-hat dipole antennas having a length and an operating frequency which are adjustable depending on an image region and an antenna
(Continued)

circuit module to adjust the operating frequency. The top-hat dipole antenna includes a pair of antenna leg parts linearly arranged while being spaced apart from each other, and a pair of top-hat parts provided at opposite distal ends of the antenna leg part to increase a current at the distal end of the antenna leg part by increasing a capacitance.

4 Claims, 19 Drawing Sheets

(58) Field of Classification Search
CPC . G01R 33/3415; G01R 33/3628; G01R 33/48
See application file for complete search history.

(56) References Cited

U.S. PATENT DOCUMENTS

| | | | | |
|---|---|---|---|---|
| 5,998,999 A * | 12/1999 | Richard | ............ | G01R 33/34046 324/318 |
| 6,232,779 B1 * | 5/2001 | Tropp | ............... | G01R 33/34046 324/318 |
| 6,344,745 B1 * | 2/2002 | Reisker | ............ | G01R 33/34046 324/318 |
| 7,733,088 B2 * | 6/2010 | Cho | ................. | G01R 33/34046 324/309 |
| 9,958,518 B2 * | 5/2018 | Du | .................... | G01R 33/34084 |
| 2003/0146750 A1 * | 8/2003 | Vaughan, Jr. | .... | G01R 33/34046 324/318 |
| 2004/0227515 A1 * | 11/2004 | Nistler | ............. | G01R 33/34046 324/318 |
| 2006/0012369 A1 * | 1/2006 | Neufeld | ........... | G01R 33/34046 324/318 |
| 2009/0206840 A1 * | 8/2009 | Overweg | ........... | G01R 33/3621 324/322 |
| 2010/0066370 A1 | 3/2010 | Clark et al. | | |
| 2015/0054506 A1 | 2/2015 | Eberler et al. | | |
| 2022/0206091 A1 * | 6/2022 | Brunner | ............. | G01R 33/3685 |

FOREIGN PATENT DOCUMENTS

| | | |
|---|---|---|
| KR | 10-1860228 B1 | 5/2018 |
| WO | 2014/133391 A1 | 9/2014 |

OTHER PUBLICATIONS

Written Opinion dated Mar. 5, 2021, for corresponding International Patent Application No. PCT/KR2020/017356.
J.T. Vaughan et al., "7T vs. 4T: RF Power, Homogeneity, and Signal-to-Noise Comparison in Head Images", Magnetic Resonance in Medicine, 2001, vol. 46, pp. 24-30.
C. J. Snyder et al., "Comparison Between Eight- and Sixteen-Channel TEM Transceive Arrays for Body Imaging at 7 T", Magnetic Resonance in Medicine, 2012, vol. 67, pp. 954-964.
Jeffrey W. Hand et al., "Electromagnetic and Thermal Modeling of SAR and Temperature Fields in Tissue Due to an RF Decoupling Coil", Magnetic Resonance in Medicine, 1999, vol. 42, pp. 183-192.
Suchit Kumar et al., "Improvement of B1+ Homogeneity along Z-Direction Using Top-Hat Dipole-Antenna pTX Array for Body Imaging at 7 Tesla", International Society for Magnetic Resonance in Medicine, 2016, vol. 24, 2149, 2 pages.
Chang-Hyun Oh et al., "Multi-Channel Top-Hat Dipole RF Coil with Large Field-Of-View for 7 T Brain MR Imaging", International Congress on Magnetic Resonance Imaging (ICMRI), 2017, SS02 02, 1 page.
Chang-Hyun Oh et al., "Top-Hat Dipole RF Coil with Large Field of View for 7 T Brain MR Imaging", International Society for Magnetic Resonance in Medicine, 2017, vol. 25, 0767, 3 pages.
Suchit Kumar et al., "Extended Field-Of-View Brain Imaging using 7 Tesla MRI with Receive-only Multichannel Top-hat Dipole Antenna RF Coil", Journal of Magnetic Resonance, S 19 00491, 31 pages.
Chang-Hyun Oh et al., "Top-Hat Dipole RF Coil with Large Field of View for 7 T Brain MR Imaging", International Society for Magnetic Resonance in Medicine, 2017, Pitch RF Arrays and Systems (0767), 12 pages.
Suchit Kumar et al., "Whole-brain imaging with receive-only multichannel top-hat dipole antenna RF coil at 7 T MRI", Journal of the Korean Physical Society, 2022, vol. 80, pp. 920-927.

* cited by examiner (a)

(b)

METHOD AND DEVICE FOR MAGNETIC RESONANCE IMAGING BY IMPLEMENTING INDUCTIVE TUNING CIRCUIT FOR ADJUSTING OPERATING FREQUENCY AND USING TOP- HAT DIPOLE ANTENNA HAVING LENGTH FREELY ADJUSTABLE DEPENDING ON REGION OF INTEREST

CROSS-REFERENCE TO RELATED APPLICATION

The present application is a national stage filing under 35 U.S.C § 371 of PCT application number PCT/KR2020/017356 filed on Dec. 1, 2020, which is based upon and claims the benefit of priority to Korean Patent Application No. 10-2019-0159556, filed on Dec. 4, 2019 and Korean Patent Application No. 10-2020-0164661, filed on Nov. 30, 2020, in the Korean Intellectual Property Office. All of the aforementioned applications are incorporated herein by reference in their entireties.

TECHNICAL FIELD

Embodiments of the inventive concept described herein relate to a method and a device for magnetic resonance imaging by implementing an inductive tuning circuit for adjusting an operating frequency and using a top-hat dipole antenna having a length freely adjustable depending on a region requiring an image.

STATEMENT REGARDING GOVERNMENT SPONSORED RESEARCH OR DEVELOPMENT

The present invention is derived from a study conducted as part of the Electronic System Industry Core Technology Development (R&D) of the Korea Evaluation Institute of Industrial Technology (KEIT) (Task Identification Number, 1415162344, Task Number, 10076675, Research Name, Development of High Strength Concentration Ultrasound System for MRI-based Treatment of Brain Disease and Urology Disease, Task Conducting Institution, Medonica Co., Ltd., Research Period, Contribution Ratio, 1/2, Jan. 1, 2019 to Dec. 31, 2019), and a study conducted as part of the Development of Ultra High Field (7T) Brain MRI System of the Ministry of Science and ICT, the Ministry of Trade, Industry and Energy, the Ministry of Health & Welfare, the Ministry of Food and Drug Safety (Task Identification Number, 1711138003, Task Number, RS-2020-KD000041, Task Management Institution, Korea Medical Device Development Fund, Task Conducting Institution, Korea University Research and Business Foundation, Sejong Campus, Contribution Ratio, 1/2, Research Period, Sep. 1, 2020 to Dec. 31, 2025).

Meanwhile, there is no property interest of the Korean government, which is the subject of providing the task, in any aspect of the present invention.

BACKGROUND ART

Magnetic resonance imaging (MRI) is a technology to make a resonance for a specific nuclide (a hydrogen) by applying a radio frequency to a magnetization vector of a nuclide (hydrogen, phosphorous, sodium, or carbon), which is present in a human body, inside a uniform main magnetic field and by receiving a magnetic resonance signal generated, as the magnetization vector is re-aligned on a vertical plane, and by re-configuring the magnetic resonance signal to make an image.

In general, transmission of a pulse for making resonance for the magnetization vector and reception of a magnetic resonance signal generated from the pulse are performed by a radio frequency coil. In this case, the radio frequency coil may be classified into a radio frequency transmitter coil to transmit a radio frequency signal for making resonance for the magnetization vector (a radio frequency transmit mode), a radio frequency receiver coil to receive the magnetic resonance signal (a radio frequency receive mode), and a radio frequency transceiver coil to perform both the radio frequency transmit mode and the radio frequency receive mode. In addition, a gradient coil is provided outside the radio frequency coil to obtain spatial information.

The magnitude of a static magnetic field clinically used in an MRI device ranges from 0.3 to 1.5, 3.0, and 7.0 Tesla (T). Recently, an ultra-high magnetic field MRI (UHF-MRI) device of, for example, 9.4 Tesla and 11.7 Tesla has also been developed. Such a strong magnetic field has a higher signal to noise ratio (SNR) and higher spatial resolution.

The commercial MRI employs an integrated body radio frequency coil inside a cylinder of the MRI device. However, the integrated body radio frequency coil has a difficulty in performing MRI, because a magnetic resonance image having a non-uniform signal distribution is obtained due to a non-uniform magnetic resonance '$B_1$' generated by the integrated body radio frequency coil in a magnetic field of above 3.0 Tesla or 7.0 Tesla.

The radio frequency coil used in acquiring the magnetic resonance image is provided in a dipole antenna type or a loop type. Conventionally, although the loop-type coil is mainly used, the loop-type coil may generate a magnetic field 'B1' having irregular homogeneity in an UHF. Accordingly, recently, the dipole antenna having uniform homogeneity in the UHF has been increasingly used.

In addition, the conventional arrangement of dipole antennas, which are used for the MRI image, shows a lower homogeneity in the magnetic field 'B1' in an image part. This is because of the surface current distribution of the dipole antenna. In other words, a current having a lower intensity flows at the end of the leg of the dipole antenna, and a current having a higher density may flow at the center of the dipole antenna.

To overcome the above problem, there has been suggested a method in which a top-hat is attached to the end of the dipole to change the distribution of a surface current, thereby increasing the homogeneity of the magnetic field in the longitudinal direction. In addition, to increase the homogeneity of the magnetic field on an imaging plane, currents of different amplitude and phase are applied to several radio frequency coils and the combined magnetic fields is obtained, such that the distribution of the magnetic fields on the plane may be more uniformly improved.

DETAILED DESCRIPTION OF THE INVENTION

Technical Problem

Embodiments of the inventive concept provide a device for acquiring a magnetic resonance image signal, capable of generating a magnetic field having a uniform homogeneity in a region for acquiring an image, while adjusting an operating frequency.

Meanwhile, the technical problems that are achieved in the inventive concept may not be limited to what has been described herein, and other technical problems not described herein may be clearly understood from the following detailed description by persons skilled in the art.

Technical Solution

According to an exemplary embodiment, a device for acquiring a magnetic resonance image signal includes a plurality of top-hat dipole antennas having a length and an operating frequency which are adjustable depending on an image region and an antenna circuit module to adjust the operating frequency. The top-hat dipole antenna includes a pair of antenna leg parts linearly arranged while being spaced apart from each other, and a pair of top-hat parts provided at opposite distal ends of the antenna leg part to increase a current at the distal end of the antenna leg part by increasing a capacitance.

The top-hat part may be bent inward from a contact portion with the antenna leg part to increase the current at the distal end of the antenna leg part by increasing the capacitance.

The antenna circuit module may further include a tuning circuit unit to decrease the operating frequency of the top-hat dipole antenna and to perform impedance matching.

The tuning circuit unit may include a tuning inductor series-connected to the top-hat dipole antenna to increase an inductance of the tuning circuit unit, and an impedance matching inductor and an impedance matching capacitor to perform the impedance matching depending on the operating frequency by adjusting the inductance and the capacitance.

The antenna circuit module may further include a receive radio frequency coil including a plurality of loop coils, and the receive radio frequency coil is provided inside an arrangement of the plurality of top-hat dipole antennas.

The top-hat dipole antennas may be connected to different antenna circuit modules, and currents having mutually different amplitudes and phases flow through the top-hat dipole antennas by these antenna circuit modules.

Each antenna leg part may include a plurality of antenna leg segments and an antenna leg capacitor interposed between the antenna leg segments to adjust the tuning frequency.

The top-hat dipole antenna may have a first length when provided at a first position, and may have a second length when provided at a second position except for the first position.

The device may include a mirror-plate module adjacent to one end portion of the plurality of top-hat dipole antennas and provided perpendicularly to the antenna leg part.

The mirror-plate module may include a plurality of mirror plates provided in a stack structure and a dielectric layer provided between the mirror plates.

The mirror plate may include a first mirror plate and a second mirror plate stacked at an upper portion or a lower portion of the first mirror plate. The mirror plate may include several pieces provided in a grid form.

The first mirror plate and the second mirror plate are stacked such that the pieces included in the first mirror plate cross the pieces included in the second mirror plate.

Advantageous Effects of the Invention

According to an embodiment of the inventive concept, the magnetic resonance image signal acquiring device may adjust the operating frequency depending on the magnetic field, while generating the magnetic field having constant homogeneity in the region for acquiring an image.

Meanwhile, the effects produced by the inventive concept are not limited to the aforementioned effects, and any other effects not mentioned herein will be clearly understood by those skilled in the art to which the inventive concept pertains.

BEST MODE

Advantage points and features of the inventive concept and a method of accomplishing thereof will become apparent from the following description with reference to accompanying drawings and embodiments to be described in detail with reference to the accompanying drawings. However, the inventive concept may be embodied in various different forms, and should not be construed as being limited only to the illustrated embodiments. Rather, these embodiments are provided as examples so that this disclosure will be thorough and complete, and will fully convey the concept of the inventive concept to those skilled in the art. The inventive concept may be defined by scope of the claims.

Unless otherwise specified, all terms used herein, including technical or scientific terms, have the same meanings as those generally understood by those skilled in the art to which the inventive concept pertains. It will be further understood that terms used herein should be interpreted as having a meaning that is consistent with their meaning in the context of this disclosure and the relevant art and will not be interpreted in an idealized or overly formal sense unless expressly so defined in the inventive concept.

The terms used in the inventive concept are provided for the illustrative purpose, but the inventive concept is not limited thereto. As used herein, the singular terms are intended to include the plural forms as well, unless the context clearly indicates otherwise. Furthermore, it will be further understood that the terms "comprises", and/or various modifications, such as "comprising," "includes" and/or "including", when used herein, specify the presence of stated compositions, ingredients, components, steps, operations, and/or elements, but do not preclude the presence or addition of one or more other compositions, ingredients, components, steps, operations, and/or elements. In the disclosure, the term "and/or" indicates each of associated listed items and include various possible combinations of one or more of the associated listed items.

Hereinafter, an embodiment of the inventive concept will be described in detail with reference to the accompanying drawings.

Figure 1:
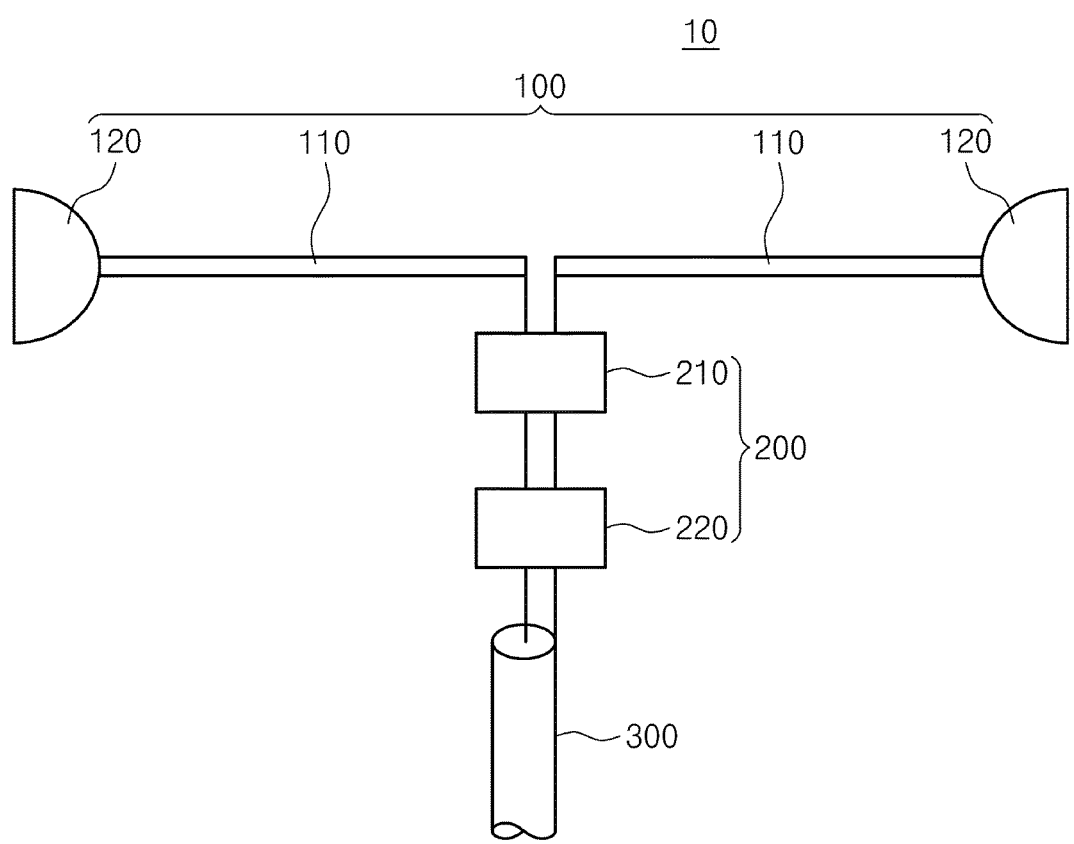
FIG. 1 is a schematically illustrating a magnetic resonance image signal acquiring device, according to an embodiment of the inventive concept.

FIG. 1 is a schematically illustrating a device (hereinafter, a magnetic resonance image signal acquiring device) for acquiring a magnetic resonance signal 10, according to an embodiment of the inventive concept.

Referring to FIG. 1, the magnetic resonance image signal acquiring device 10 includes a top-hat dipole antenna 100, an antenna circuit module 200, and a coaxial cable 300.

The top-hat dipole antenna 100 may be adjusted in length, depending on a region (that is, an image area) for acquiring a magnetic resonance image (MRI). A dipole antenna has an intrinsic operating frequency determined depending on the whole length thereof. Accordingly, according to the inventive concept, even the top-hat dipole antenna 100 has an operating frequency determined depending on the whole length thereof. According to the inventive concept, the magnetic resonance image signal acquiring device 10 may include a plurality of top-hat dipole antennas 100.

The top-hat dipole antenna 100 includes a pair of antenna leg parts 110 linearly disposed while being spaced apart from each other, and a pair of top-hat parts 120 disposed at opposite distal ends of the antenna leg parts 110.

The pair of top-hat parts 120 disposed at opposite distal ends of the antenna leg parts 110 increase the capacitance of the dipole antenna, which increases a current at the distal ends of the antenna leg parts 110 which are surrounding regions of the top-hat parts 120. Such an increase of the current may enhance the transmit efficiency of the dipole antenna. Accordingly, the top-hat part 120 may decrease the operating frequency of the top-hat dipole antenna 100, and may improve the uniformity of the magnetic field generated from the top-hat dipole antenna 100.

The antenna circuit module 200 to be described later may include a tuning circuit unit 210, a ground breaker unit 220, and a detuning circuit unit 230.

Figure 2:
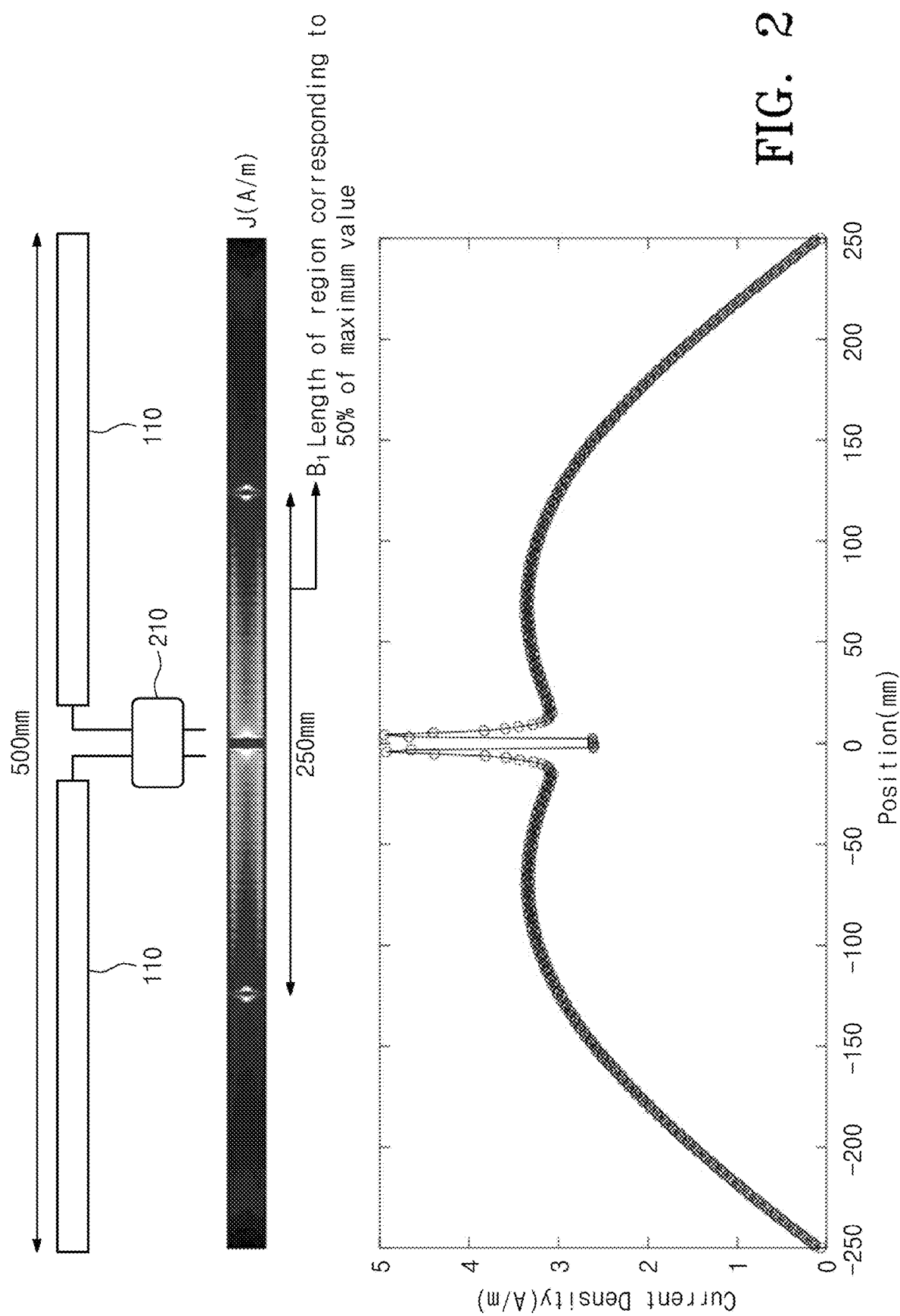
FIG. 2 is a view illustrating an existing structure of a dipole antenna and a current distribution density depending on a position of an antenna leg part, in which a lower graph illustrates a current distribution in a longitudinal direction.

FIG. 2 is a view illustrating an existing structure of a dipole antenna and a current distribution density varied depending on an inner position of an antenna leg part, and the graph of FIG. 2 illustrates a current distribution in a longitudinal direction.

It may be understood with reference to FIG. 2, that the length of the image region is sufficiently ensured by employing the top-hat dipole antenna 100 having a longer length.

The length of a region corresponding to 50% of the maximum intensity of the magnetic field 'B1' employed to acquire the magnetic resonance image shows 250 mm from the center of the dipole antenna, when a frame diameter of the dipole antenna is 245 mm, and the length of the dipole antenna was 500 mm on the assumption that the intensity of the magnetic field was 7 T, and the frequency is 298 MHz, The dipole antenna typically has a surface current greatly flowing in the antenna central region thereof. Accordingly, as illustrated in FIG. 2, a brighter region having a higher current density is formed at the antenna central region, and a darker region having a lower current density is formed at opposite antenna end areas.

When the magnetic resonance image is acquired, the magnetic field '$B_1$' is employed, and the intensity of the magnetic field '$B_1$' is proportional to the current density. Accordingly, the magnetic field '$B_1$' is shown with a stronger intensity at the central antenna region having the higher current density, and shown with a weaker intensity at the opposite antenna end areas having the lower current density.

In other words, even if a dipole antenna having the longer length of 500 mm is employed, a higher-quality magnetic resonance image may be acquired only at the central length portion of 250 mm, but a magnetic resonance image having a sufficient image quality may not be acquired at a remaining portion of the dipole antenna.

Figure 3:
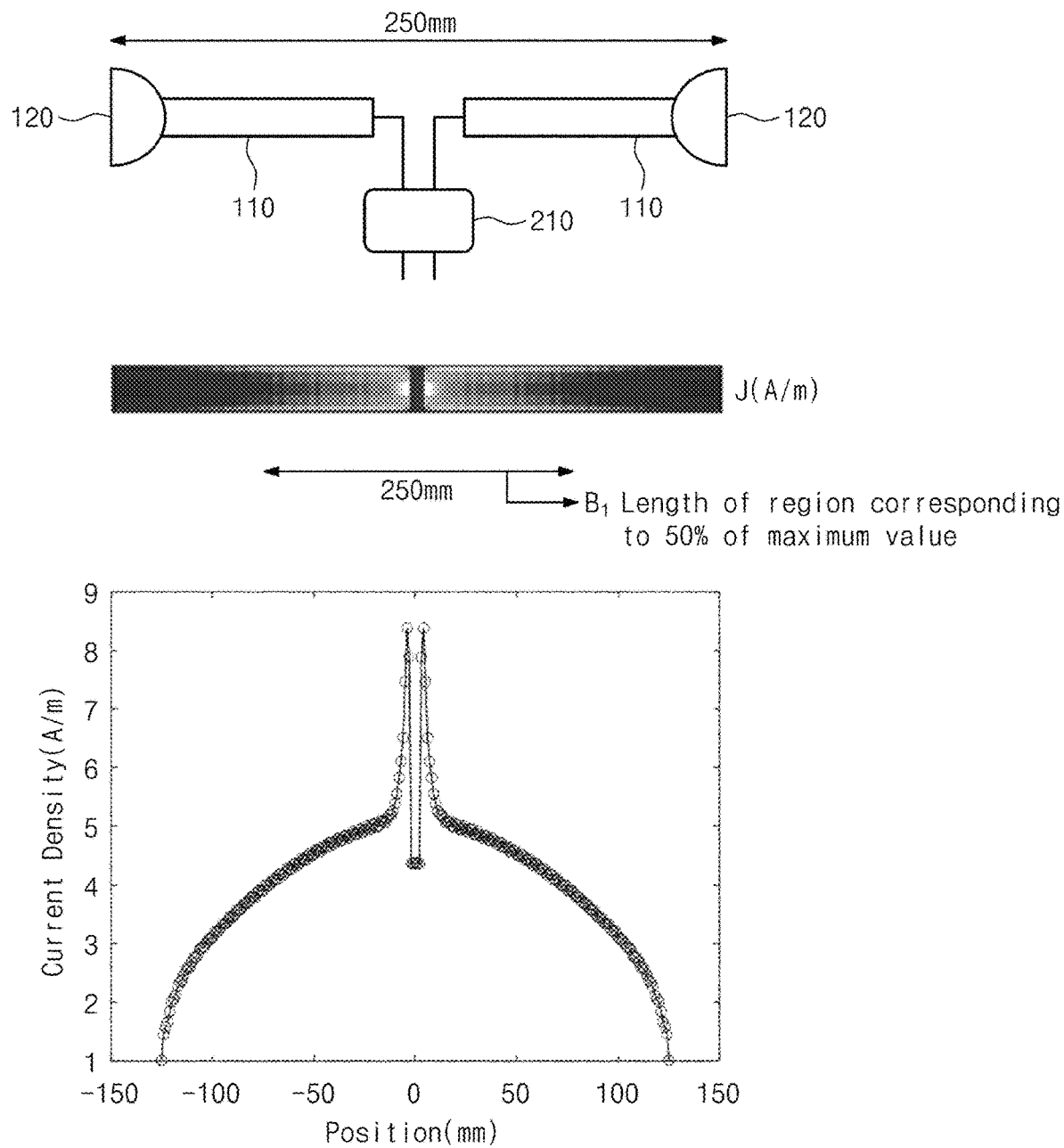
FIG. 3 illustrates the structure of the top-hat dipole antenna 100 formed by adding a pair of top-hat parts 120 to the structure of an existing dipole antenna and the distribution of a current density depending on an inner position of an antenna leg part, in which a lower graph illustrates current distribution in a longitudinal direction.

FIG. 3 illustrates the structure of the top-hat dipole antenna 100 formed by adding the pair of top-hat parts 120 to the structure of an existing dipole antenna and the distribution of a current density varied depending on an inner position of the antenna leg part. The graph of FIG. 3 illustrates the current distribution in a longitudinal direction.

It may be understood with reference FIG. 3 that, even if the top-hat dipole antenna 100 has a shorter length, as the top-hat parts are employed, the image region may be adjusted to have a sufficiently longer length.

When a frame diameter of the dipole antenna is 245 mm, and the length of the dipole antenna is 250 mm under the assumption that the intensity of the magnetic field is 7.0 T, and the frequency is 298 MHz, the length of a region corresponding to 50% of the maximum intensity of the magnetic field 'B₁' employed to acquire the magnetic resonance image is 200 mm from the center of the dipole antenna.

In other words, it may be understood that the range for acquiring the higher-quality magnetic resonance image is not reduced, even though the whole antenna length of the top-hat dipole antenna 100 is reduced to a half of the length of the dipole antenna of FIG. 2. Accordingly, the top-hat dipole antenna 100 may be employed to capture an image of the head of a human body.

The effects may be produced due to the top-hat parts 120 provided at opposite ends of the antenna leg part 110. The effects of the top-hat part 120 are as follows.

The operating frequency of the dipole antenna has an intrinsic value varied depending on the length of the dipole antenna. When the length of the dipole antenna is reduced, the operating frequency of the dipole antenna is increased. As the top-hat part 120 is added, the operating frequency of the dipole antenna is decreased. Accordingly, even if the length of the dipole antenna is reduced, the operating frequency of the dipole antenna may be maintained. In this case, the decrement of the operating frequency may be adjusted by adjusting a material constituting the top-hat part 120 or the size of the top-hat part 120.

In addition, it may be understood that the top-hat part 120 increases the intensity of the magnetic field at the opposite ends of the dipole antenna. Accordingly, it may be understood that the length of a region corresponding to 50% of the maximum value of the magnetic field 'B1' is hardly changed even though the whole length of the top-hat dipole antenna 100 is 250 mm which is a half of the length of the dipole antenna of FIG. 2.

Figure 4:
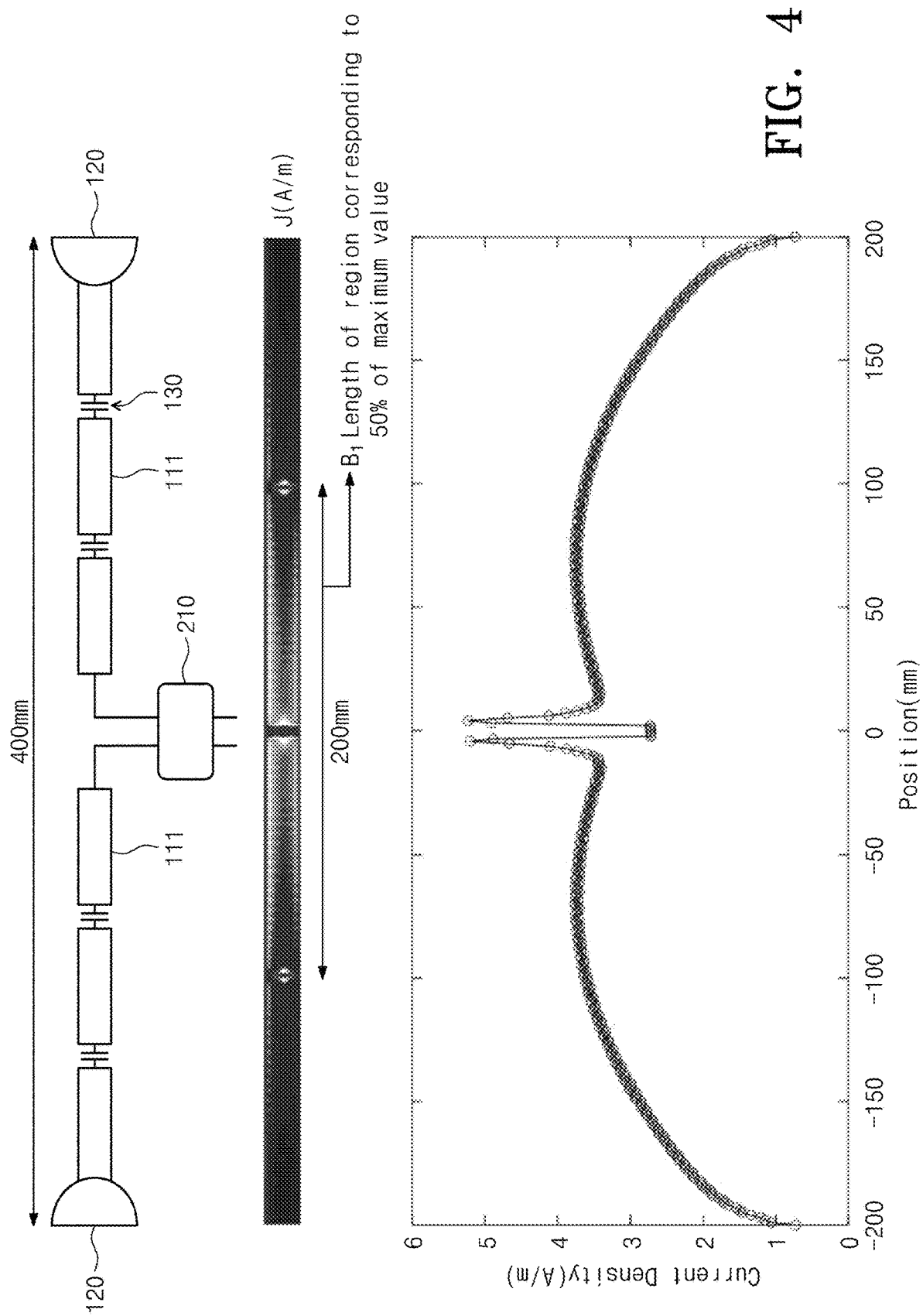
FIG. 4 illustrates the structure, in which an antenna leg part 110 of the top-hat dipole antenna 100 is divided into a plurality of antenna leg segments 111 and an antenna leg capacitor 130 is interposed between the antenna leg segments, and the distribution of a current density depending on an inner position of an antenna leg part, in which a lower graph illustrates the current distribution in a longitudinal direction.

FIG. 4 illustrates the structure, in which the antenna leg part 110 of the top-hat dipole antenna 100 is divided into a plurality of antenna leg segments 111, and an antenna leg capacitor 130 is interposed between the antenna leg segments 111, and the distribution of a current density varied depending on an inner position of the antenna leg part 110. The graph of FIG. 4 illustrates the current distribution in a longitudinal direction.

Referring to FIG. 4, it may be understood that the antenna leg capacitor 130 is added to prevent the length of the top-hat dipole antenna 100 from being excessively reduced as the frequency is increased, such that the length of the image region is sufficiently ensured.

Each antenna leg part 110 may be divided into the plurality of antenna leg fragments 111. In this case, the antenna leg capacitor 130 may be interposed between the antenna leg fragments 111. Accordingly, the antenna leg capacitor 130 increases the operating frequency of the top-hat dipole antenna 100.

In other words, while the top-hat part 120 is added to decrease the operating frequency of the dipole antenna in FIG. 3, the antenna leg capacitor 130 is interposed between the antenna leg fragments 111 to increase the operating frequency.

Figure 5:
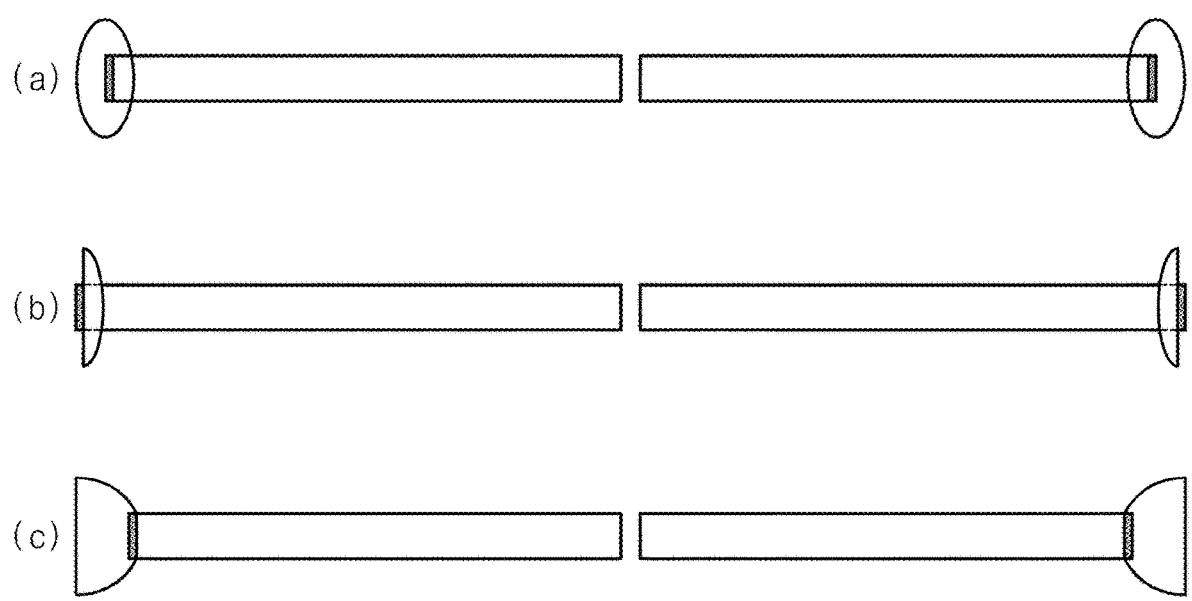
FIGS. 5A to 5C are views schematically illustrating various shapes applicable to the top-hat part 120 of the top-hat dipole antenna 100.
Figure 6A:
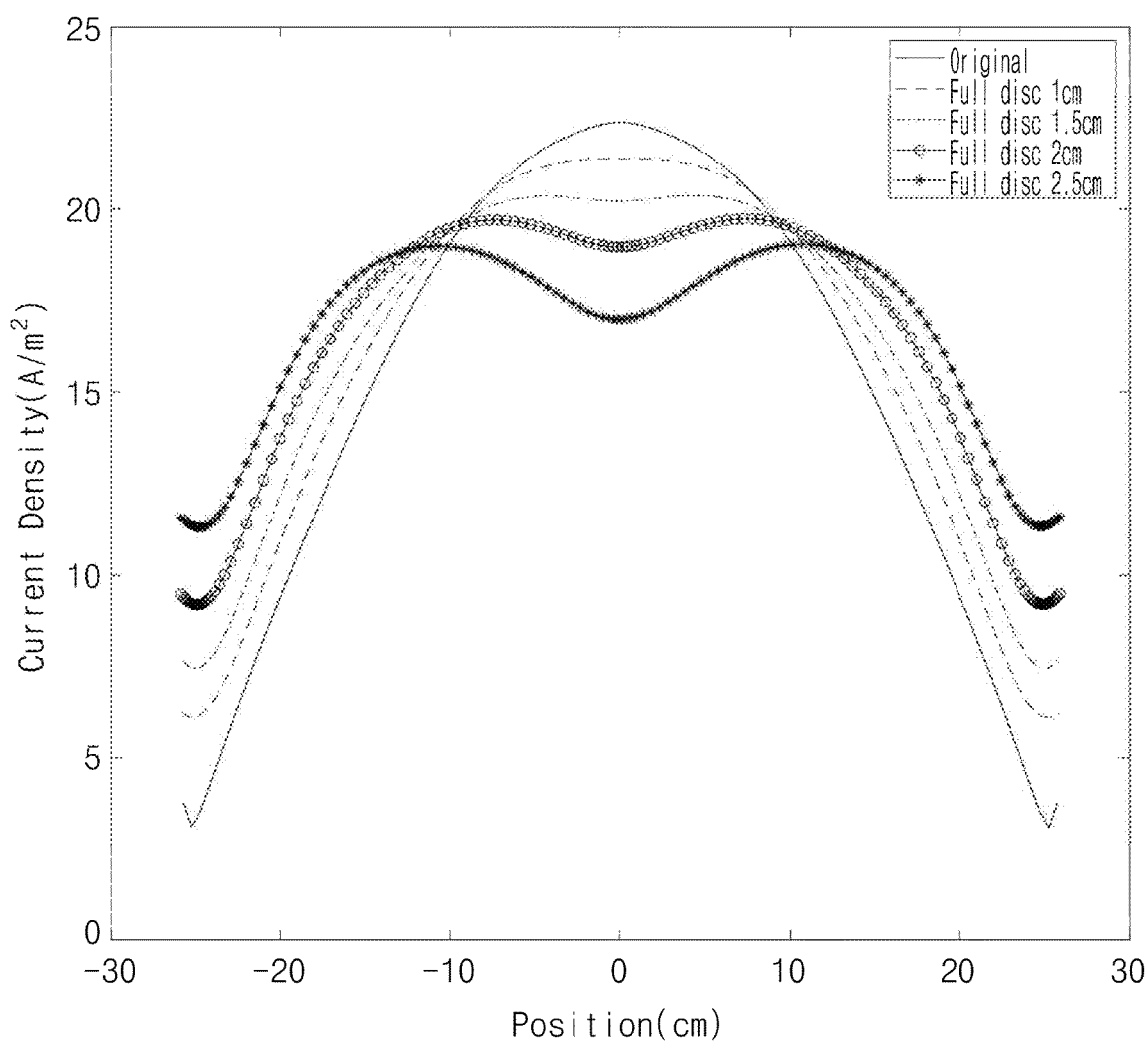
FIGS. 6A to 6C are graphs illustrating the change in intensity of a magnetic field, depending on an inner position of the top-hat dipole antenna 100 in a longitudinal direction from the central region of the top-hat dipole antenna, in each shape of the top-hat part of FIGS. 5A to 5C.
Figure 6B:
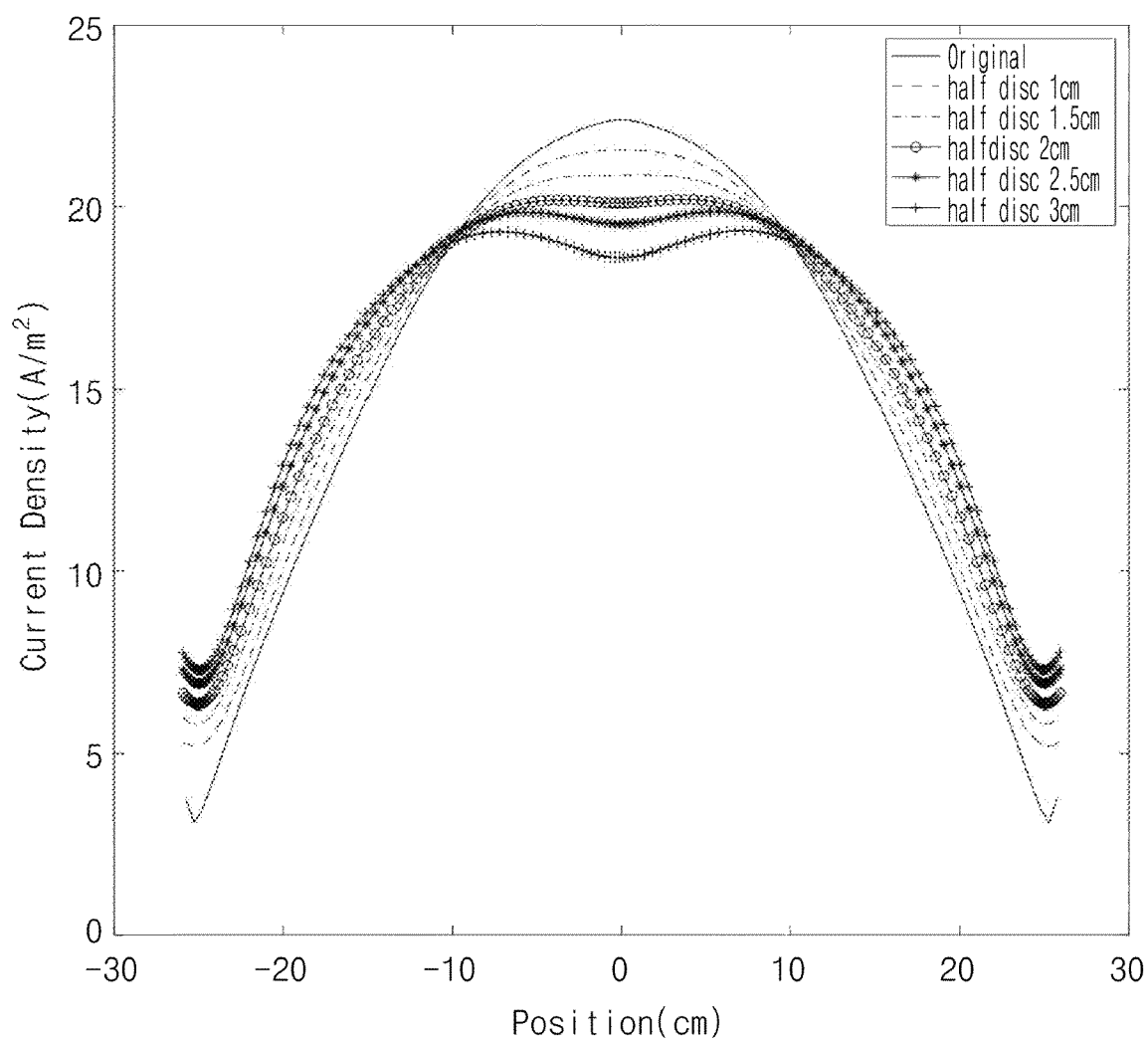
Figure 6C:
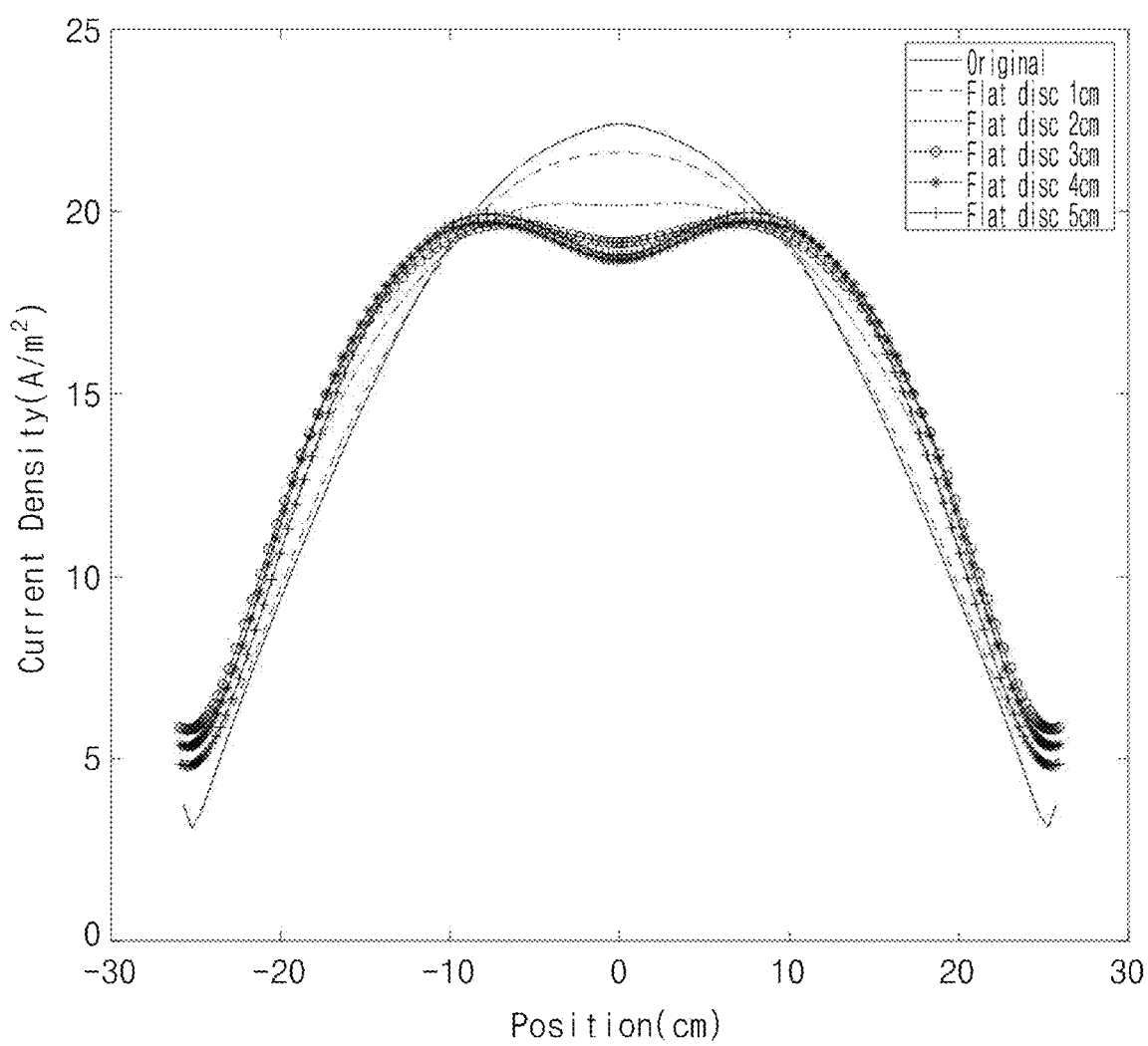

FIGS. 5A to 5C are views schematically illustrating various shapes applicable to the top-hat part 120 of the top-hat dipole antenna 100. FIGS. 6A to 6C are graphs illustrating the change in intensity of a magnetic field, depending on an inner position of the top-hat dipole antenna 100 in a longitudinal direction from the central region of the top-hat dipole antenna 100, in each shape of the top-hat part 120 of FIGS. 5A to 5C.

Referring to FIGS. 5A to 5C and FIGS. 6A to 6C, the shape of the top-hat part 120 may include any one of a circular disk shape perpendicular to the antenna leg part 110 (see FIG. 5A), a semi-circular disk shape perpendicular to the antenna leg part 110 (see FIG. 5B), and a semi-circular disk shape parallel to the antenna leg part 110 (see FIG. 5C). In this case, it may be understood that the distribution form of the current density in the image region is adjusted depending on the shape and the size of the top-hat part 120.

According to the inventive concept, although the semi-circular disk shape (see FIG. 5B) perpendicular to the antenna leg part 110, which is a shape indicating a uniform current density in a wider image region, is applied, the shape of the top-hat part 120 is not limited thereto. For example, various shapes may be applied to the top-hat part 120 in addition to the shape illustrated in FIG. 5.

Figure 7:
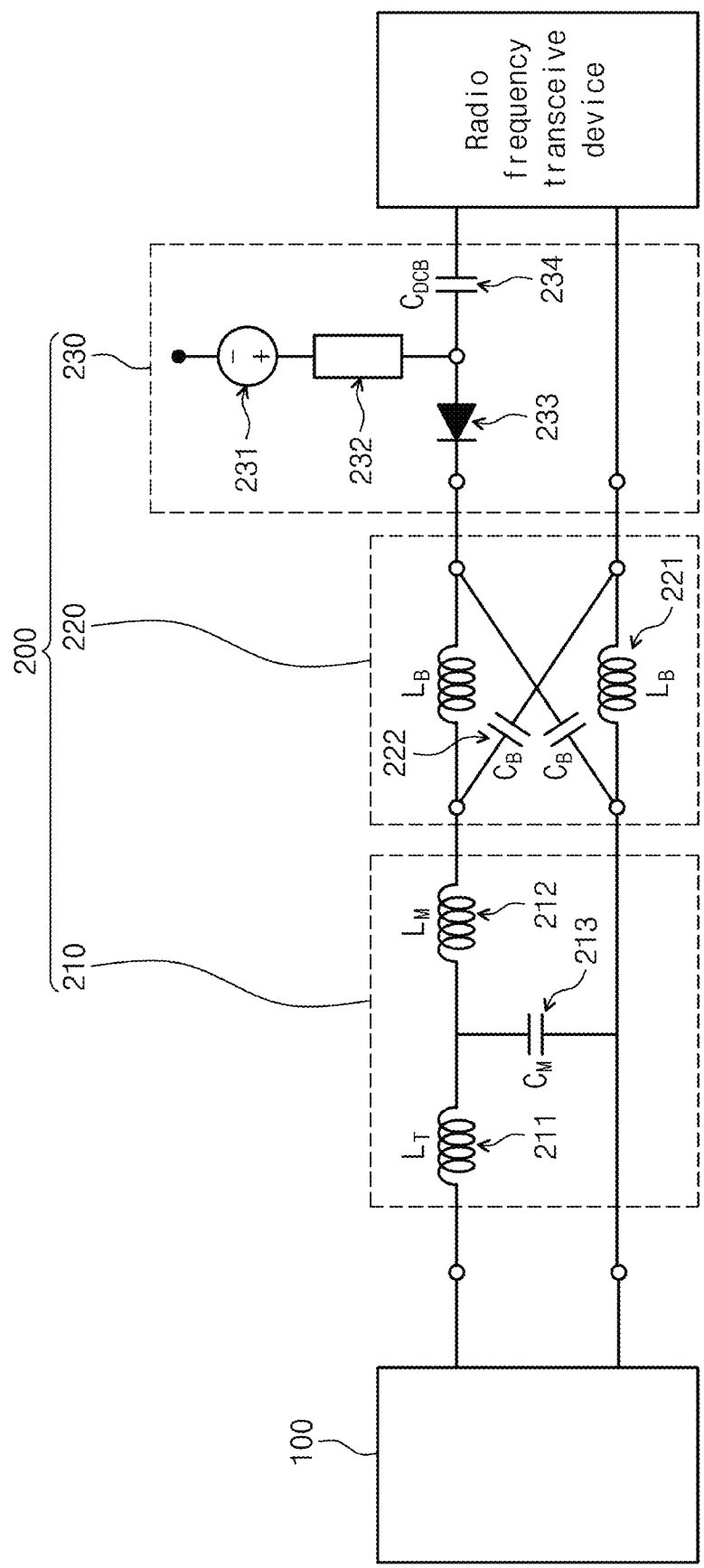
FIG. 7 is a view schematically illustrating an antenna circuit module 200, according to an embodiment of the inventive concept.

FIG. 7 is a view schematically illustrating an antenna circuit module 200, according to an embodiment of the inventive concept.

Referring to FIG. 7, the antenna circuit module 200 may include the tuning circuit unit 210, the ground breaker unit 220, and the detuning circuit unit 230.

The tuning circuit unit 210 includes a tuning inductor 211, an impedance matching inductor 212, and an impedance matching capacitor 213 to decrease the operating frequency of the top-hat dipole antenna 100 and to perform impedance matching.

In details, the tuning inductor 211 is series-connected to the top-hat dipole antenna 100 to increase the inductance of the tuning circuit unit 210, such that the operating frequency is decreased. Accordingly, although the operating frequency is increased as the whole length of the top-hat dipole antenna 100 is reduced, the operating frequency is decreased through the tuning inductor 211, such that the operating frequency is uniformly maintained. In addition, it is obvious that the operating frequency is decreased to a frequency desired by a user regardless of the length the top-hat dipole antenna 100, by increasing the inductance of the tuning inductor 211.

The impedance matching inductor 212 and the impedance matching capacitor 213 perform the impedance matching by adjusting an inductance and a capacitance. According to the inventive concept, the inductance of the impedance matching inductor 212 and the capacitance of the impedance matching capacitor 213 are adjusted, such that the impedance of 50Ω is obtained at the frequency of 298 MHz.

The ground breaker unit 220 includes a pair of lattice inductors 221 and a pair of lattice capacitors 222 to remove noise, which results from a current unnecessarily flowing, from the coaxial cable 300 and to improve safety.

The detuning circuit unit 230 includes a direct current (DC) voltage source 231, a radio frequency choke 232, a pin diode 233, and a DC voltage blocking capacitor 234. In a transmit mode, the pin diode 233 is shorted by a forward DC bias, and the top-hat dipole antenna 100 is tuned and matched by the tuning circuit unit 210. In addition, in a receive mode, the pin diode 233 is open by a reverse DC bias, and the top-hat dipole antenna 100 is detuned, such that the top-hat dipole antenna 100 is not operated. The radio frequency choke 232 prevents a current having a higher frequency from flowing into the DC voltage source 231 in a transmit mode.

Figure 8:
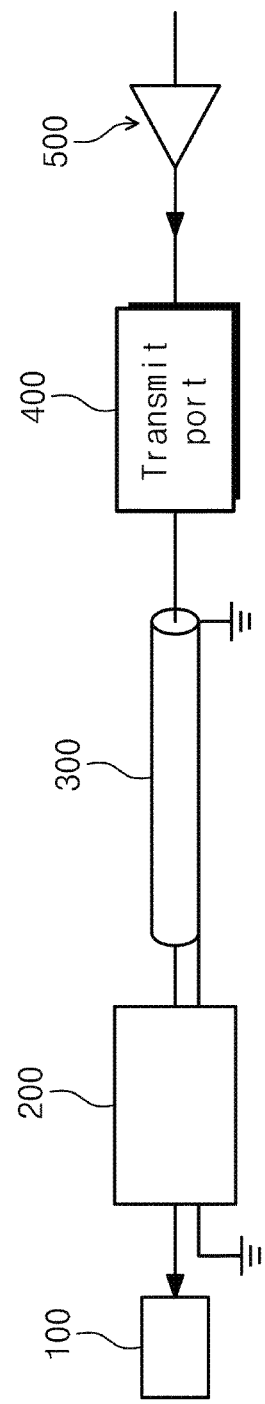
FIG. 8 is a view schematically illustrating a coaxial cable 300, a transmit port 400, and an RF transmit amplifier 500 provided at one end of the antenna circuit module 200.

FIG. 8 is a view schematically illustrating the coaxial cable 300, a transmit port 400, and a radio frequency (RF) transmit amplifier 500 provided at one end of the antenna circuit module 200.

Referring to FIG. 8, one side of the antenna circuit module 200 is connected to the top-hat dipole antenna 100, and an opposite side of the antenna circuit module 200 is connected to the coaxial cable 300.

The coaxial cable 300 is connected to the opposite side of the opposite side of the antenna circuit module 200 through the transmit port 400. The RF transmit amplifier 500 is provided to convert a low-power radio frequency pulse from an MRI spectrometer into a high-power signal transmitted to the top-hat dipole antenna 100.

Figure 9:
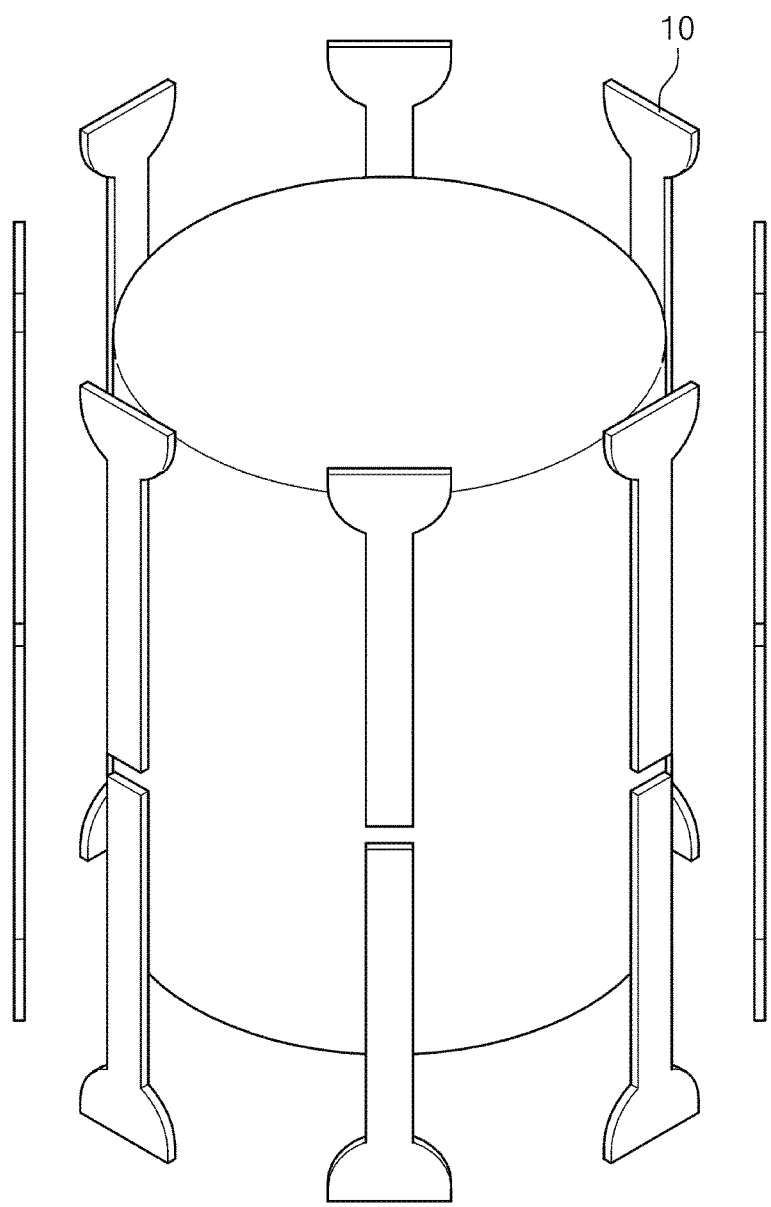
FIG. 9 is a view illustrating the arrangement of the plurality of top-hat dipole antennas 100 to acquire a body magnetic resonance image.

FIG. 9 is a view illustrating the arrangement of a plurality of top-hat dipole antennas 100 to acquire a body magnetic resonance image.

Referring to FIG. 9, to acquire the body magnetic resonance image, the plurality of top-hat dipole antennas 100 may be provided around a cylinder such that the top-hat dipole antennas 100 are arranged to be parallel to each other at regular distances.

Figure 10:
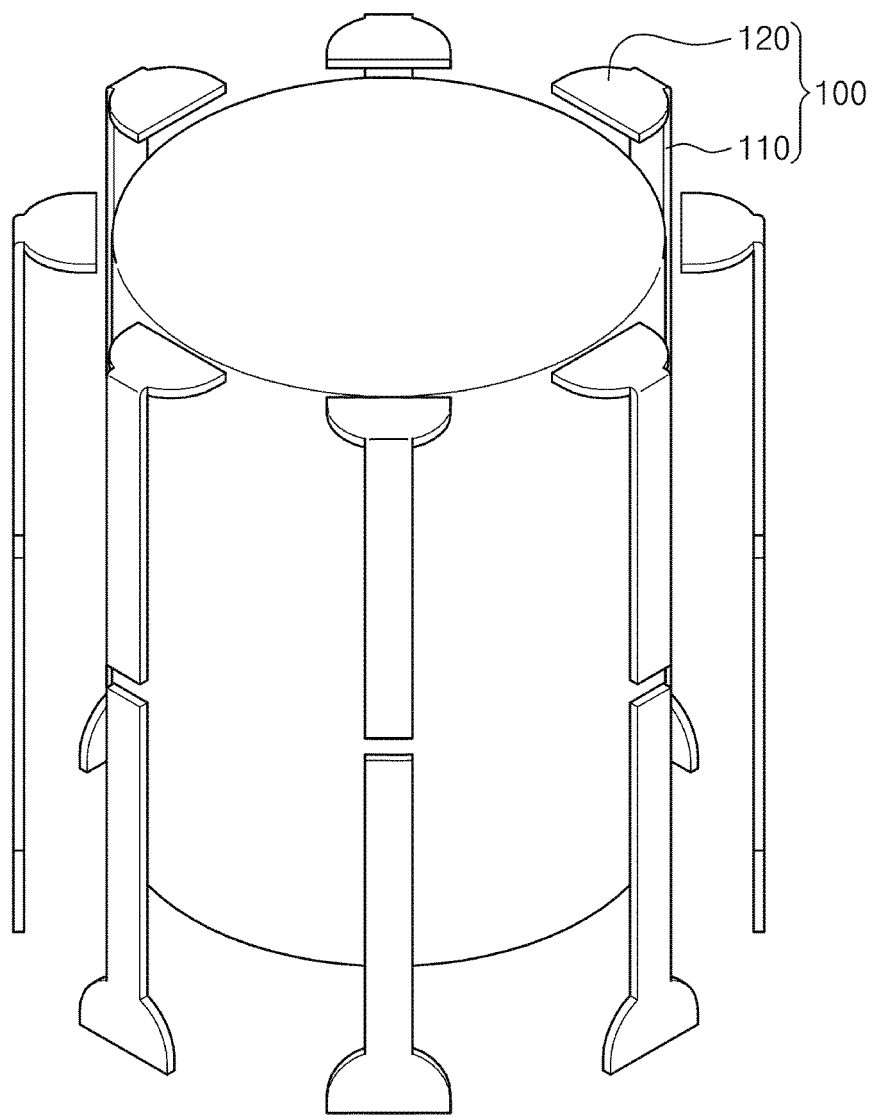
FIG. 10 is a view illustrating the arrangement of the top-hat dipole antennas 100 to acquire a brain magnetic resonance image.

FIG. 10 is a view illustrating the arrangement of top-hat dipole antennas 100 having a plurality of top-hat dipoles to acquire a brain magnetic resonance image.

Referring to FIG. 10, to acquire the brain magnetic resonance image, on the assumption that the top part of the head of a human body is positioned at an upper end of the cylinder, and the neck part of the human body is positioned at a lower end of the cylinder, an upper top-hat part 120 of the pair of top-hat parts 120 is bent from the contact portion between the upper top-hat part 120 and the antenna leg part 110, toward the center of the cylinder, that is, inward of the cylinder. As described above, when the top-hat part 120 is bent toward of the center of the cylinder, the capacitance is increased at a distal end of the antenna leg part 110 to increase the flow of a current. Accordingly, the transmit efficiency is improved, such that a clearer brain magnetic resonance image is obtained.

Figure 11:
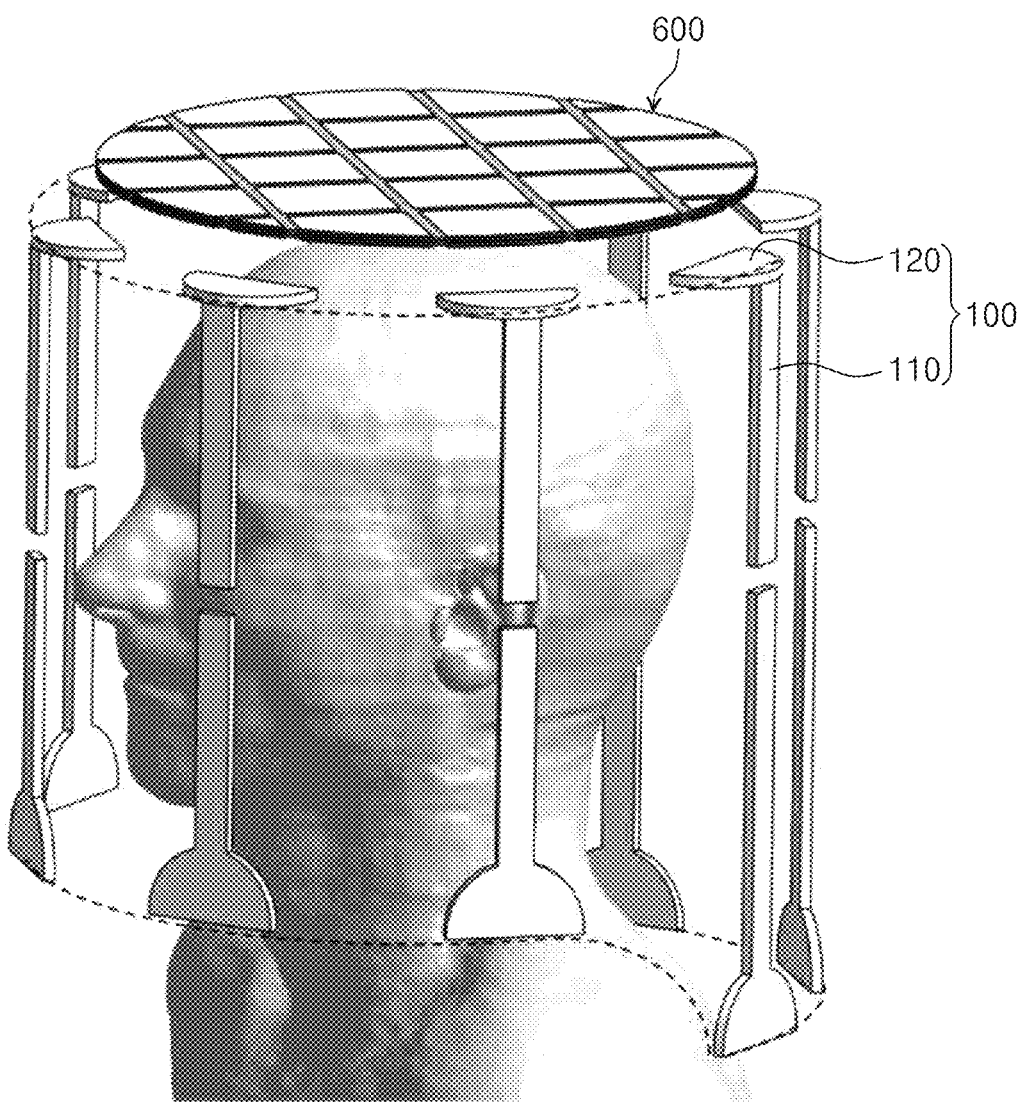
FIG. 11 is a view illustrating the arrangement of the top-hat dipole antennas 100 having mutually different lengths to acquire a brain magnetic resonance image and a cervical spine magnetic resonance image.

FIG. 11 is a view illustrating the arrangement of top-hat dipole antennas 100 including a plurality of top-hat dipoles having mutually different lengths to acquire a brain magnetic resonance image and a cervical spine magnetic resonance image.

Referring to FIG. 11, to obtain the image of the cervical spine, a top-hat dipole antenna 100 positioned at a first position, which corresponds to a back of a neck, may be provided to have a first length, and a top-hat dipole antenna 100 positioned at a second position, which corresponds to a remaining portion of the neck except for the back of the neck, may be provided to have a second length, such that the transmit RF magnetic field is sufficiently applied to the neck part. In this case, as illustrated in FIG. 11, the first length may be provided to be longer than the second length.

Figure 12:
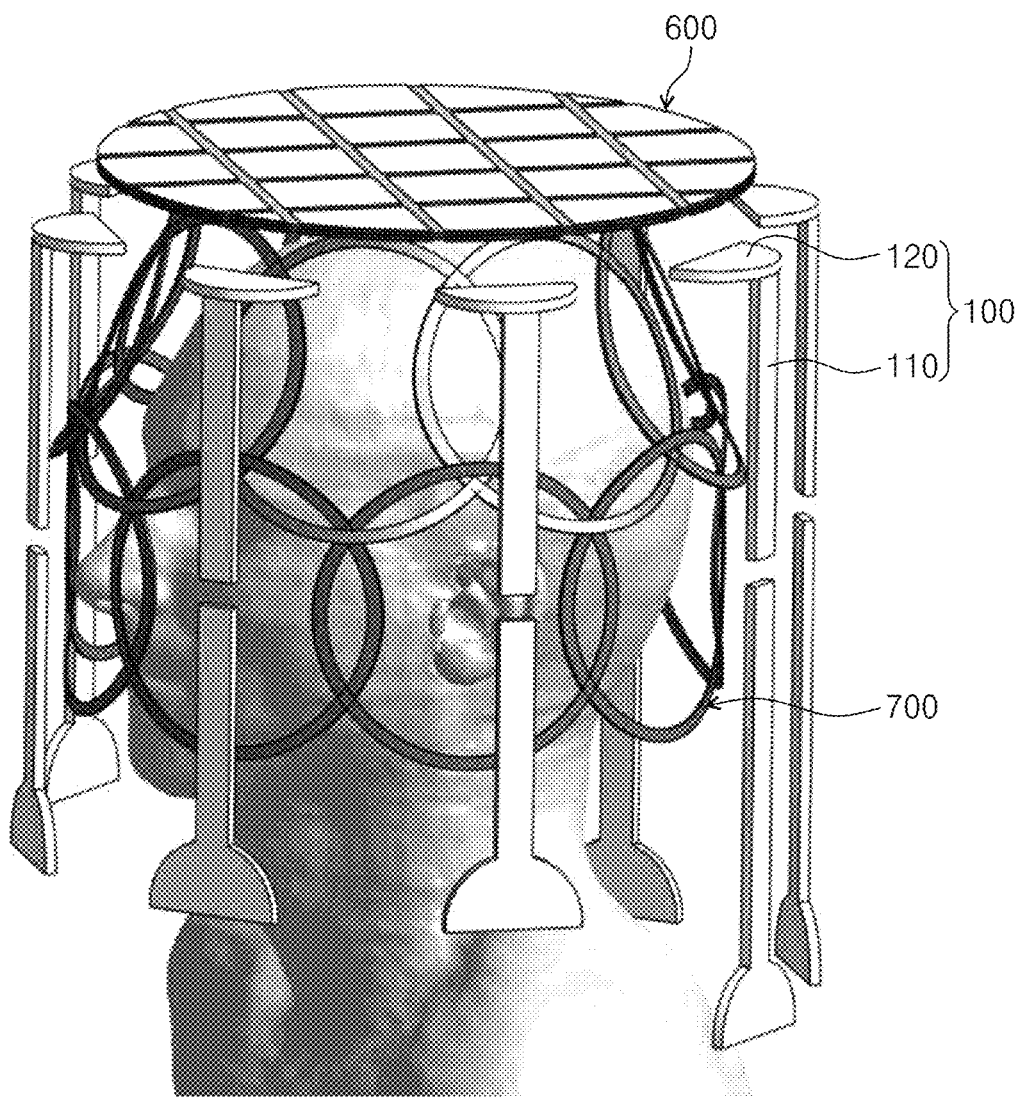
FIG. 12 is a view illustrating the arrangement of the top-hat dipole antennas 100 having a plurality of top-hat dipoles having mutually different lengths, and of a plurality of receive RF coils 700, to acquire a brain magnetic resonance image and a cervical spine magnetic resonance image.

FIG. 12 is a view illustrating the arrangement of top-hat dipole antennas 100 having a plurality of top-hat dipoles having mutually different lengths, and of a plurality of receive RF coils 700, to acquire a brain magnetic resonance image and a cervical spine magnetic resonance image.

Referring to FIG. 12, the image signal acquiring device 10 may further include the receive RF coil 700 configured to receive a magnetic resonance image signal. The receive RF coil 700 may be provided inside the arrangement of the top-hat dipole antennas 100 and may have various closed-loop circuit shapes such as a circular shape or a polygonal shape. To increase the receive efficiency of the magnetic resonance signal, the receive RF coil 700 may include a plurality of loop coils.

Figure 13:
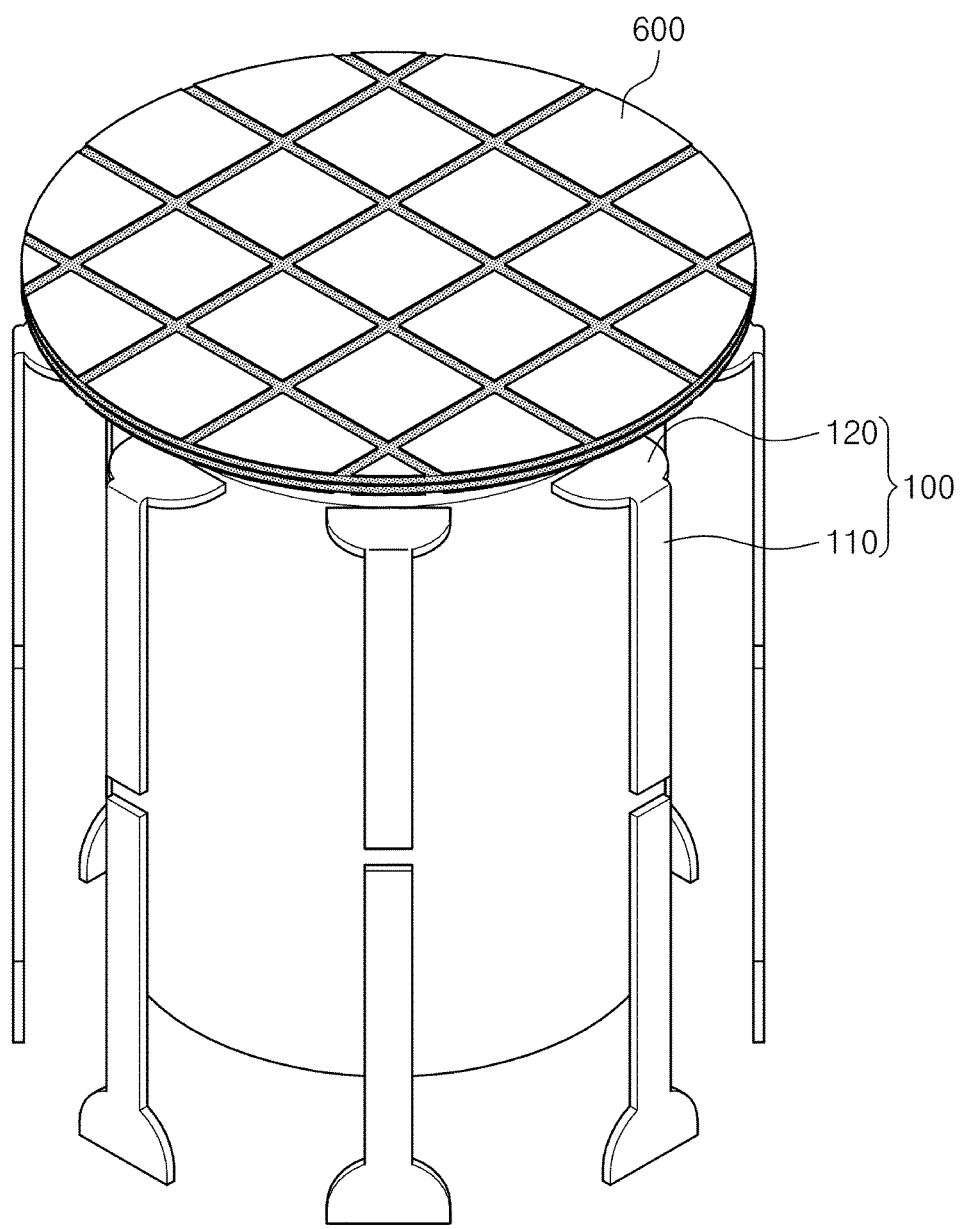
FIG. 13 is a view illustrating that a mirror-plate module is provided at an upper region of the plurality of top-hat dipole antennas 100.

FIG. 13 is a view illustrating that a mirror-plate module 600 is provided at an upper region of a plurality of top-hat dipole antennas 100. FIG. 14A is a perspective view of the mirror-plate module 600 and FIG. 14B is a side view of the mirror-plate module 600. FIG. 15 is a view illustrating the mirror-plate module 600 having the form in which mirror plates 610 are stacked.

Figure 14:
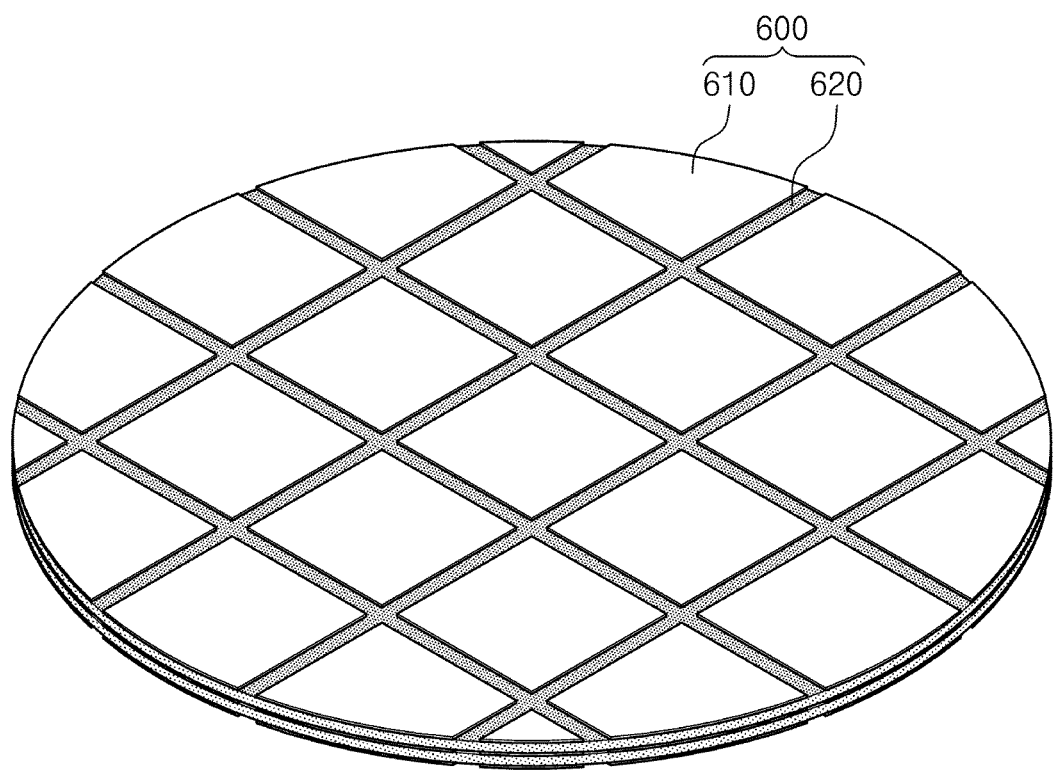
FIG. 14A is a perspective view of the mirror-plate module and FIG. 14B is a side view of the mirror-plate module.
Figure 14:
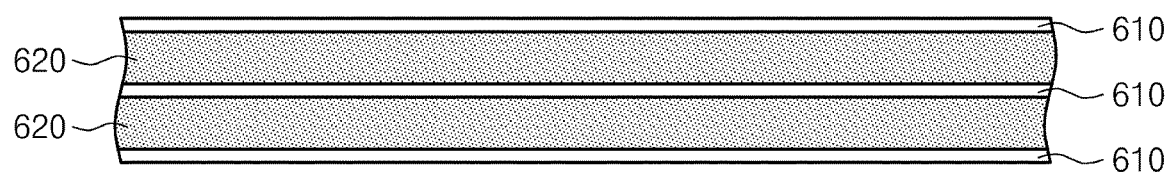
Figure 15:
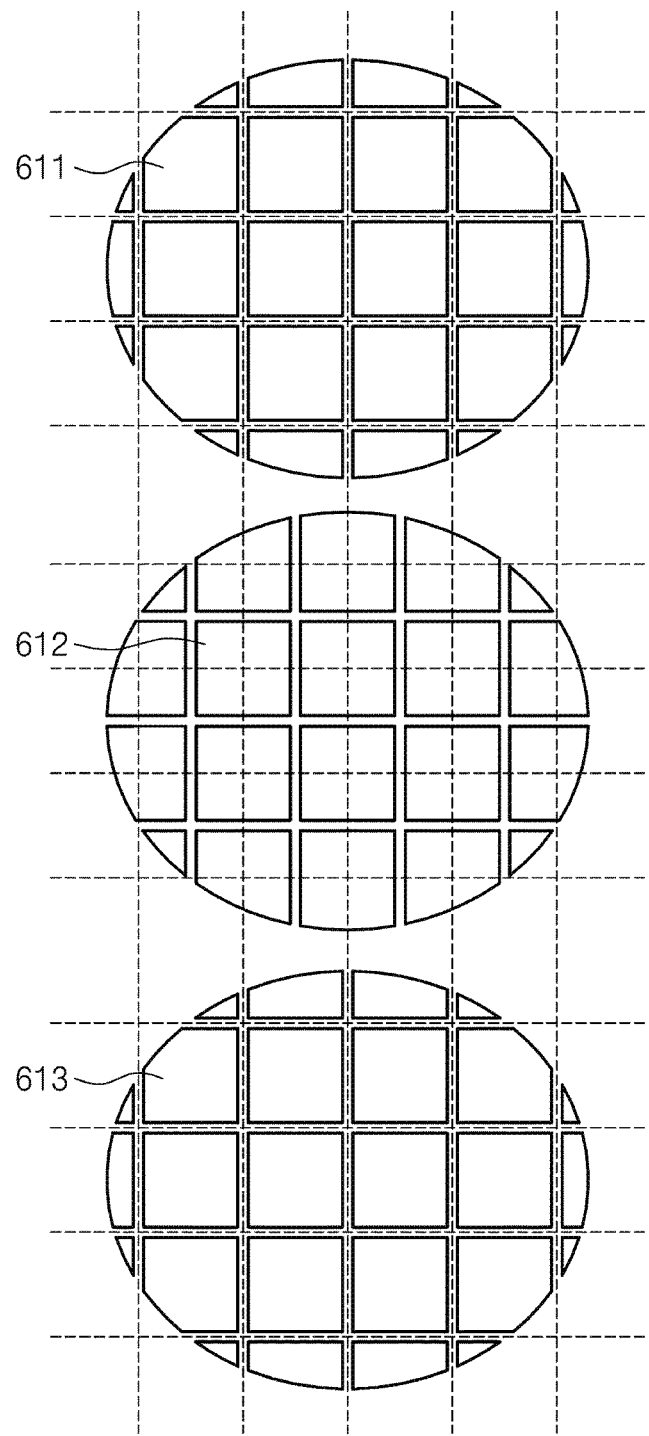
FIG. 15 is a view illustrating a mirror-plate module 600 having the form in which mirror plates 610 are stacked.

Referring to FIGS. 13 to 15, the mirror-plate module 600 may be applied, when the top-hat dipole antenna 100 is used in the transmit mode or the receive mode. The mirror-plate module 600 includes the mirror plates 610 provided in a stack structure, and a dielectric substance 620 interposed between the mirror plates 610

The mirror-plate module 600 may be provided to be adjacent to one end portion of the arrangement of the top-hat dipole antenna 100, and provided perpendicularly to the antenna leg part 110. For example, the mirror plate 610 may be provided in a region, which is adjacent to the top of the head on the arrangement of the top-hat dipole antenna 100 to acquire the brain magnetic resonance image of FIG. 10, of the one end portion of the arrangement of the top-hat dipole antenna 100.

The intensity of the magnetic field generated from the top-hat dipole antenna 100 becomes weakened toward opposite antenna ends. The mirror-plate module 600 may reflect the magnetic field radiated from the upper end of the antenna such that the magnetic field is returned to the antenna.

The magnetic field radiated from the antenna passes through the air and enters the mirror-plate module 600. In this case, the impedance difference is made between the air and the mirror-plate module 600. Accordingly, the magnetic field is reflected from the boundary of the mirror-plate module 600. The reflected magnetic field may increase the density of the magnetic field at the upper end of the antenna, and the magnetic resonance image signal acquiring device 10 according to the inventive concept may acquire a clearer magnetic resonance image at a region adjacent to the mirror-plate module 600 due to the increased density of the magnetic field.

The dielectric substance 620 may be interposed between the mirror plates 610 in the mirror-plate module 600. As the mirror plate 610 and the dielectric substance 620 are provided in the stack structure, the spacing between the mirror plates 610 may be narrowed, which increases the capacitance of the mirror-plate module 600.

The mirror plate 610 may include a plurality of mirror plates including a first mirror plate 611, a second mirror plate 612, and a third mirror plate 613. Although the drawing illustrates that three mirror plates 610 are included, the number of mirror plates 610 may be changed through the selection of a user.

Each mirror plate 610 may include several pieces in a grid form. In this case, the first mirror plate 611 and the second mirror plate 612 may be stacked such that pieces included in the first mirror plate 611 cross pieces included in the second mirror plate 612. For example, as illustrated in FIG. 15, the pieces included in the first mirror plate 611 and the pieces included in the third mirror plate 613 may be provided at the same position, and the pieces included in the second mirror plate 612 may be stacked such that the pieces included in the second mirror plate 612 cross the pieces included in the first mirror plate 611 and the pieces included in the third mirror plate 613.

The mirror plate formed in such a manner has a plate capacitor having a square shape. Regarding the connected form of the mirror plate, in the case of a coil provided by way of example, a square plate of 50 mm×50 mm and an adjacent square plate are overlapped with each other by ¼ of the size of the square plate, and connected to each other in the state of a capacitor while being insulated from each other through a thin dielectric tape. The equivalent impedence of the mirror plate is significantly smaller than 50 ohm at the Larmor frequency of 298 MHz in a magnetic field of 7 T. Accordingly, the mirror plate operates in an almost short state. A three-layer structure is formed with the short state double layered and employed as an electrical mirror plate.

Although FIGS. 7 and 8 illustrate that one type of antenna circuit module 200 is connected to all top-hat dipole antennas 100, mutually different types of antenna circuit modules 200 may be connected to the top-hat dipole antennas 100 depending on the selection of the user. In this case, currents different from each other in amplitude and phase are allowed to flow in top-hat dipole antennas 100, such that magnetic fields having mutually different intensities may be formed by the top-hat dipole antennas 100. Accordingly, the magnetic field may be more uniformly formed in the image region.

When the top-hat dipole antenna 100 is used in the transmit mode, the magnetic field corresponding to 298 MHz is transmitted. When the magnetic field corresponding to the higher frequency is transmitted as described above, the whole impedance of the mirror-plate module 600 is reduced, which exhibits the same effect as the effect of one metal plate. Accordingly, the magnetic field generated by the top-hat dipole antenna 100 may be reflected.

To the contrast, according to the inventive concept, a gradient coil is provided to detect the position of a human body in the process of acquiring the magnetic resonance image, although the gradient coil is not included in the magnetic resonance image signal acquiring device 10. The gradient coil radiates a magnetic field corresponding to a lower frequency (about 2 kHz). When the magnetic field of the lower frequency is received in the mirror-plate module 600, the impedance of the mirror-plate module 600 becomes a higher impedance, thereby exhibiting an effect in which the mirror-plate module 600 is open, that is, the mirror-plate module 600 is absent. Accordingly, the magnetic field generated from the gradient coil is passed with no eddy current generation such that the interference is avoided.

Figure 16:
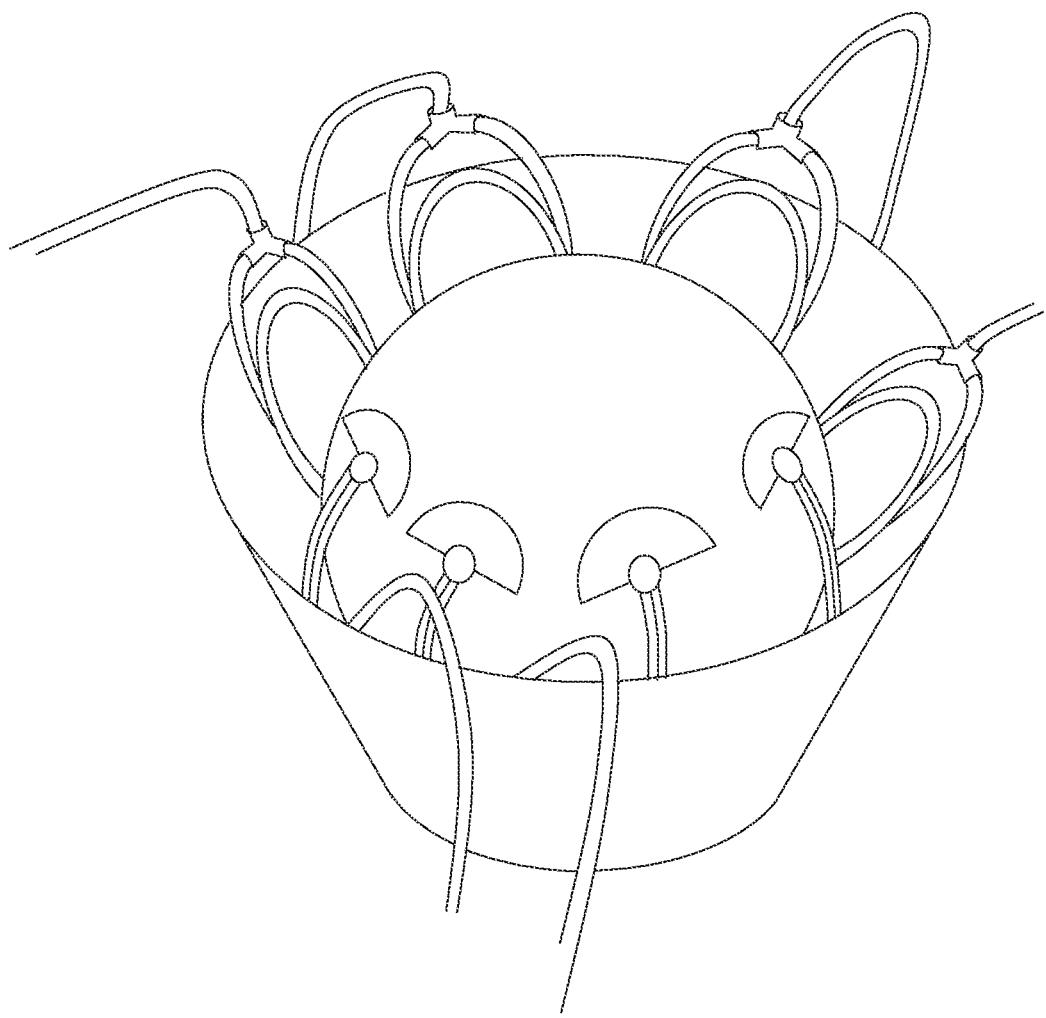
FIG. 16 is a view illustrating a magnetic resonance image signal acquiring device 10 having no a mirror-plate module.

FIG. 16 is a view illustrating the magnetic resonance image signal acquiring device 10 in which the mirror-plate module 600 is not included.

Figure 17:
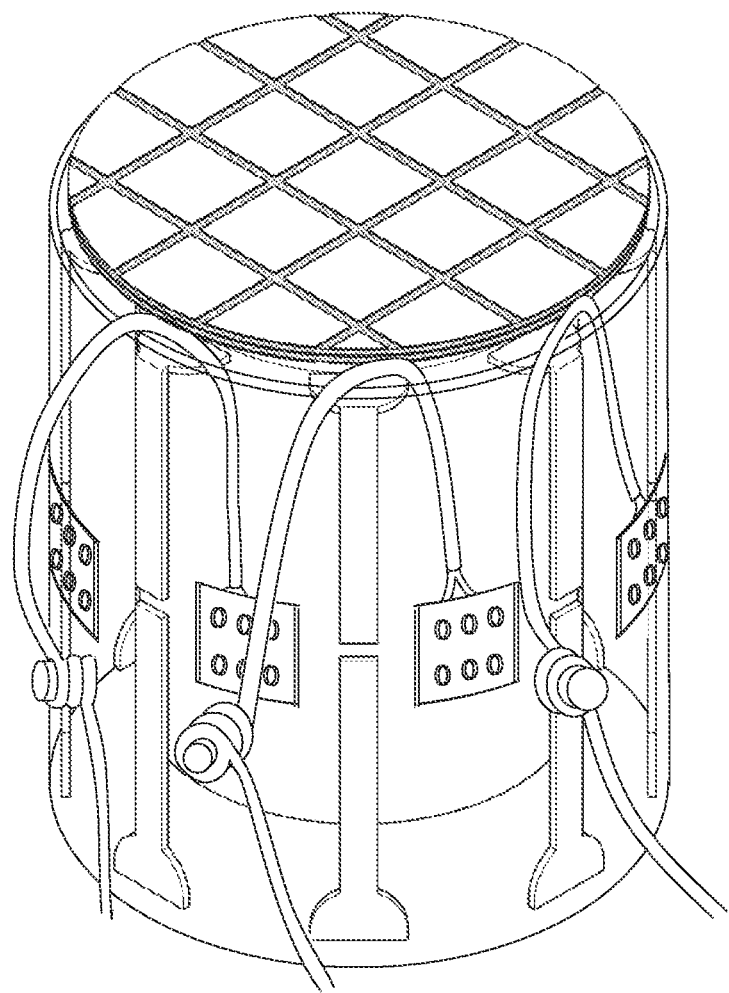
FIG. 17 is a view illustrating the magnetic resonance image signal acquiring device 10 including a mirror-plate module.

FIG. 17 is a view illustrating the magnetic resonance image signal acquiring device 10 including the mirror-plate module 600.

According to an embodiment of the inventive concept, the magnetic resonance image signal acquiring device 10 may include the top-hat dipole antenna 100, the tuning circuit unit 210, the coaxial cable 300, the transmit port 400, the RF transmit amplifier 500, the mirror-plate module 600, and the receive RF coil 700 to adjust the length and the operating frequency of the top-hat dipole antenna 100 while generating the magnetic field having a constant homogeneity in the imaging region, thereby acquiring the higher-quality magnetic resonance image. In addition, the radio frequency signals having mutually different amplitudes and mutually different phases are combined and applied to several radio frequency coils, such that the distribution of the magnetic field is more homogeneously improved.

Although the present discloser has been described through the above embodiment, the embodiment is provided only for describing the spirit of the inventive concept, and the inventive concept is not limited thereto. Those skilled in the art may understand various modifications of the above-described embodiment. The scope of the inventive concept should be defined only by interpreting claims attached below.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

The invention claimed is:

1. A device for acquiring a magnetic resonance image, the device comprising:
   a plurality of top-hat dipole antennas having a length and an operating frequency which are adjustable depending on an image region; and
   an antenna circuit module configured to adjust the operating frequency,
   wherein the top-hat dipole antenna includes:
     a pair of antenna leg parts linearly arranged while being spaced apart from each other; and
     a pair of top-hat parts provided at opposite distal ends of the antenna leg part to increase a current at the distal end of the antenna leg part by increasing a capacitance,
   wherein the top-hat part is bent inward from a contact portion with the antenna leg part to increase the current at the distal end of the antenna leg part by increasing the capacitance,
   wherein the antenna circuit module includes a tuning circuit unit to decrease the operating frequency of the top-hat dipole antenna and to perform impedance matching,
   wherein the tuning circuit unit includes:
     a tuning inductor series-connected to the top-hat dipole antenna to increase an inductance of the tuning circuit unit; and
     an impedance matching inductor and an impedance matching capacitor to perform the impedance matching depending on the operating frequency by adjusting the inductance and the capacitance,
   wherein the antenna circuit module includes a receive radio frequency coil including a plurality of loop coils, and the receive radio frequency coil is provided inside an arrangement of the plurality of top-hat dipole antennas,
   wherein the top-hat dipole antennas are connected to mutually different types of antenna circuit modules, respectively, and currents having mutually different amplitudes and phases flow through the top-hat dipole antennas by the mutually different types of antenna circuit modules,
   wherein each antenna leg part includes:
     a plurality of antenna leg segments; and
     an antenna leg capacitor interposed between the antenna leg segments to increase the operating frequency,
   wherein the top-hat dipole antenna has a first length when provided at a first position, and has a second length when provided at a second position except for the first position, and
   wherein a mirror-plate module is adjacent to one end portion of the plurality of top-hat dipole antennas and provided perpendicularly to the antenna leg part.

2. The device of claim 1, wherein the mirror-plate module includes:
   a plurality of mirror plates provided in a stack structure; and
   a dielectric layer provided between the mirror plates.

3. The device of claim 2, wherein the mirror plate includes:
   a first mirror plate; and
   a second mirror plate stacked at an upper portion or a lower portion of the first mirror plate, and wherein the mirror plate includes several pieces provided in a grid form.

4. The device of claim 3, wherein the first mirror plate and the second mirror plate are stacked such that the pieces included in the first mirror plate cross the pieces included in the second mirror plate.

\* \* \* \* \*